United States Patent
Blum

(10) Patent No.: US 8,036,614 B2
(45) Date of Patent: Oct. 11, 2011

(54) REPLICA DLL FOR PHASE RESETTING

(75) Inventor: Gregory A. Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 527 days.

(21) Appl. No.: 12/270,654

(22) Filed: Nov. 13, 2008

(65) Prior Publication Data

US 2010/0120389 A1    May 13, 2010

(51) Int. Cl.
*H03L 7/06* (2006.01)
(52) U.S. Cl. .................................. 455/208; 455/265
(58) Field of Classification Search .................. 455/208, 455/209, 265, 264, 259
See application file for complete search history.

(56) References Cited

U.S. PATENT DOCUMENTS

| | | | |
|---|---|---|---|
| 6,204,709 B1 | 3/2001 | Searle et al. | |
| 7,078,949 B2 | 7/2006 | Kim et al. | |
| 7,285,997 B2 | 10/2007 | Haerle et al. | |
| 7,308,065 B2 | 12/2007 | Donnelly et al. | |
| 7,375,564 B2 | 5/2008 | Cho et al. | |
| 2006/0208780 A1 | 9/2006 | Johnson | |
| 2007/0063748 A1 | 3/2007 | Chung | |
| 2008/0157836 A1* | 7/2008 | Cho | 327/158 |

FOREIGN PATENT DOCUMENTS

| | | |
|---|---|---|
| JP | 2003-244024 | 8/2003 |
| JP | 2005-331369 | 12/2005 |

* cited by examiner

*Primary Examiner* — Stephen Jones

(57) ABSTRACT

A method, algorithm, architecture, circuits, and/or systems for using a delay-locked loop (DLL) for phase adjustment in a direct conversion radio receiver are disclosed. The DLL is configured to avoid a perceived phase shift when the control voltage to a delay line is reset upon reaching a predetermined amount. Embodiments disclosed include a DLL, a radio receiver using the DLL, a circuit for resetting the DLL, a method for recovering a modulated radio signal, and a method of synchronizing a reference clock to a radio signal. The approach can allow for improved synchronization of the reference clock to a received radio signal during baseband frequency recovery.

16 Claims, 8 Drawing Sheets

(Background)

REPLICA DLL FOR PHASE RESETTING

FIELD OF THE INVENTION

The present invention generally relates to the field of receiver circuits and methods. More specifically, embodiments of the present invention pertain to methods, algorithms, architectures, circuits, and/or systems for using a delay-locked loop (DLL) for phase adjustment and/or signal recovery in a direct conversion radio receiver.

DISCUSSION OF THE BACKGROUND

A radio receiver may be used to recover a "baseband" signal (e.g., a radio signal having a first frequency) from transmitted data (e.g., typically having a second frequency different from, and oftentimes higher than, the first frequency). For example, a transmitted signal may have an AM sinusoidal waveform (e.g., generally having the form A(t)cos($\omega_c$t), where A(t) can be any time-varying signal representing the transmitted data; and cos($\omega_c$t) is the baseband signal, where $\omega=2\pi f$, and "f" is the frequency of the sinusoidal waveform, and "t" represents time). In some cases, the baseband signal may include frequencies near 0 Hz (e.g., 1 Hz). In some wireless communication signal systems, transmitted signals can include original low frequency radio signal portions that are modulated to the higher transmitted carrier frequencies (e.g., in a radio-frequency [RF] signal) for transmission. Such original low frequency components (i.e., the baseband radio signal) can then be converted or recovered from the relatively high frequency components by using a radio receiver.

In a typical conversion to baseband signal frequencies, one or two mixers or multiplier circuits can be used for a "direct down" conversion approach where incoming data (e.g., a radio signal) is directly converted from the transmission frequency or broadcast channel (e.g., typically from about 40 to about 60 kHz) to the baseband frequency (e.g., about 1 Hz) in a receiver. However, one drawback of this approach is a potential mismatch between the transmission frequency and a reference frequency of the receiver. If those frequencies are not identical, a "delta" frequency or frequency difference will be converted into a signal portion or component in a receiver output waveform for the recovered radio signal.

Several different architectures have been used to solve the problem of mismatch between the transmission frequency and the reference frequency of the receiver. One such architecture, shown in FIG. 1, employs delay-locked loop 120 in a receiver indicated by the general reference character 100. The delay element 108 is used to take a signal from a reference source, in this instance the voltage-controlled oscillator 110 coupled to a phase-locked loop 112 that receives a reference clock signal from the reference clock generator 114, and provide a delayed (or phase-shifted) signal as a reference oscillator with the delay being variable corresponding to its gain and the value applied to its control input. The output from the delay element (or reference oscillator) is used in the I-channel in processing the transmitted radio signal to obtain a recovered radio signal (transmitted data).

The signal from reference oscillator is also used in a feedback loop to set the level of control signal, x, for the delay element. The signal is phase shifted in a 90° phase shifter 106. The resulting signal is combined with the radio signal in the Q-channel mixer. The output of the Q-channel mixer is then processed by a low pass filter 104-Q and the resulting signal is used as the control signal for the delay element.

From an analysis of the circuit, it is observed that the controlling input to the delay element is negatively proportional to the delta of time. This implies that after a long period of time, the control voltage of the delay element would also become increasingly large in magnitude. This may not be practical for a system with limited control or power supply voltage. To overcome this issue, two potential solutions have been identified.

One method involves repeatedly resetting the DLL at a fixed rate. FIG. 2 illustrates a reset circuit for resetting a DLL 200 at a fixed rate. In the DLL 200, mixer 202 (which corresponds to mixer 102-Q in FIG. 1) provides an output to low-pass filter 210 (which corresponds to filter 104-Q in FIG. 1) formed by resistor R1, capacitor C1, and operational amplifier 204 (which receives both the RC-filtered output of mixer 202 and a reference voltage). A delay control signal output (x) from low-pass filter 210 is input into delay line 206 (which corresponds to delay line 108 in FIG. 1), which also receives a reference clock via reference path 208. Switch S1 resets the low-pass filter by discharging capacitor C1. During a reset operation, switch S1 is closed (e.g., in response to an active reset signal) for a length of time sufficient to discharge substantially all of the charge on capacitor C1. To reset the DLL at a fixed rate, the reset switch is periodically pulsed.

At large phase errors, the control voltage should return to its correct delay value after being reset. This will take a certain amount of time, depending upon the loop response time. During this reset time, the loop will generally be in error and may cause the output of the I-channel to decrease in value. With a large enough signal bandwidth-to-reset period ratio, this can be filtered out with a low pass filter. However, if the bandwidth of the data is near the reset frequency, a ripple in the output may occur. This ripple can become significant enough to cause errors, especially in the presence of noise.

The second method entails two replica delay lines of the same length of the main delay line that provide a 0 and $2\pi$ reference control voltage. The control voltage of the main delay line is then reset when it reaches either reference value.

Referring to FIGS. 3A and 3B, this method employs a DLL reset circuit having replica circuit portions, utilizing sine/cosine function repeatability. The DLL reset circuit is indicated by the general reference character 300. As shown in FIG. 3A, replica circuit portions, such as delay lines 304 and 306, are used in detecting the $2\pi$ threshold. The outputs of replica delay lines 308 can be monitored until the output of delay line 304 (controlled by $x_a$) equals cos(0) and the output of delay line 306 (controlled by $x_b$) equals cos($2\pi$). Thus, $x_a$ and $x_b$ may have fixed or predetermined values such that $x_a$ is substantially equal to a predetermined minimum value for x, and $x_b$ is substantially equal to a predetermined maximum value for x. Referring now to FIG. 3B, comparator circuit 312 can then be used to detect when delay control signal x gets as large as $x_b$ so that a pulse can be provided to close switch S1 in low-pass filter 310 (which corresponds to filter 104-Q in FIG. 1) formed by resistor R1, capacitor C1, and operational amplifier 314. When S1 is closed, operational amplifier 314 can produce a unity gain feedback for input $x_a$ such that delay control signal x can be reset to the value of input $x_a$. Of course, the $x_a$ and $x_b$ inputs may be switched in the scheme of FIG. 3B for a negative-ramping x.

This second method consumes extra power (e.g., by the delay lines 304, 306) to provide the reference control voltage. Also, the output of delay lines 304, 306 can vary significantly as a function of process parameters. This means that the reference voltages may have to move significantly to compensate for this source of error.

SUMMARY OF THE INVENTION

Embodiments of the present invention relate to methods, algorithms, architectures, circuits, and/or systems for using a delay-locked loop (DLL) for phase adjustment in a direct conversion radio receiver.

In one embodiment, a delay-locked loop includes: (i) a replica delay block, configured to receive a reference clock signal, a reference voltage or current, and a delay synchronization signal, and to output a delayed clock signal; (ii) a phase and/or frequency detector configured to output the delay synchronization signal in response to the reference clock signal and the delayed clock signal; and (iii) a delay line comprising a plurality of main delay blocks operatively connected in series, the delay line configured to receive the reference clock signal, the delay synchronization signal and a delay control signal from a loop circuit including the DLL, and to output a delayed clock signal.

In another embodiment, a receiver circuit includes: (i) a first channel configured to receive a radio signal and provide a recovered radio signal from the radio signal and a delayed clock signal; and (ii) a delay-locked loop configured to receive a reference clock signal and a radio signal and provide the delayed clock signal from the radio signal and the reference clock signal, the delay-locked loop configured to shift the delayed clock signal an integral number of reference clock signal periods when reset.

In another embodiment, a delay reset circuit for a DLL includes: (i) a filter circuit configured to receive a phase error signal and a reset signal, and provide a delay control signal, the filter circuit configured to set the delay control signal to a reference value in response to the reset signal; and (ii) a comparator, the comparator configured to receive the delay control signal and provide the reset signal in response to the delay control signal reaching one or more predetermined values.

In another embodiment, a method of recovering a modulated radio signal includes the steps of: (i) generating a delay adjustment signal by delaying a reference clock by a configurable delay; (ii) phase-shifting the delay adjustment signal to provide a phase adjustment signal; (iii) generating a delay control signal from a received radio signal and the phase adjustment signal; (iv) generating said delay control signal from a received radio signal and said phase-shifted clock signal; and (v) recovering a modulated radio signal from the received radio signal and the delayed clock signal.

In another embodiment, a method of synchronizing a reference clock to a radio signal includes the steps of: (i) receiving the radio signal in a first and a second channel, the first channel providing a recovered radio signal using a delay adjustment signal, and the second channel providing a delay control signal using a phase adjustment signal derived from the delay adjustment signal; (ii) controlling a delay element using the delay control signal, the delay element receiving a reference clock signal and providing the delay adjustment signal; and (iii) resetting the delay control signal when the delay control signal reaches a predetermined value.

Embodiments of the present invention can advantageously provide a reliable approach for synchronization of a reference clock to a radio signal during baseband frequency recovery. These and other advantages of the present invention will become readily apparent from the detailed description of preferred embodiments below.

DETAILED DESCRIPTION OF THE PREFERRED EMBODIMENTS

Figure 1:
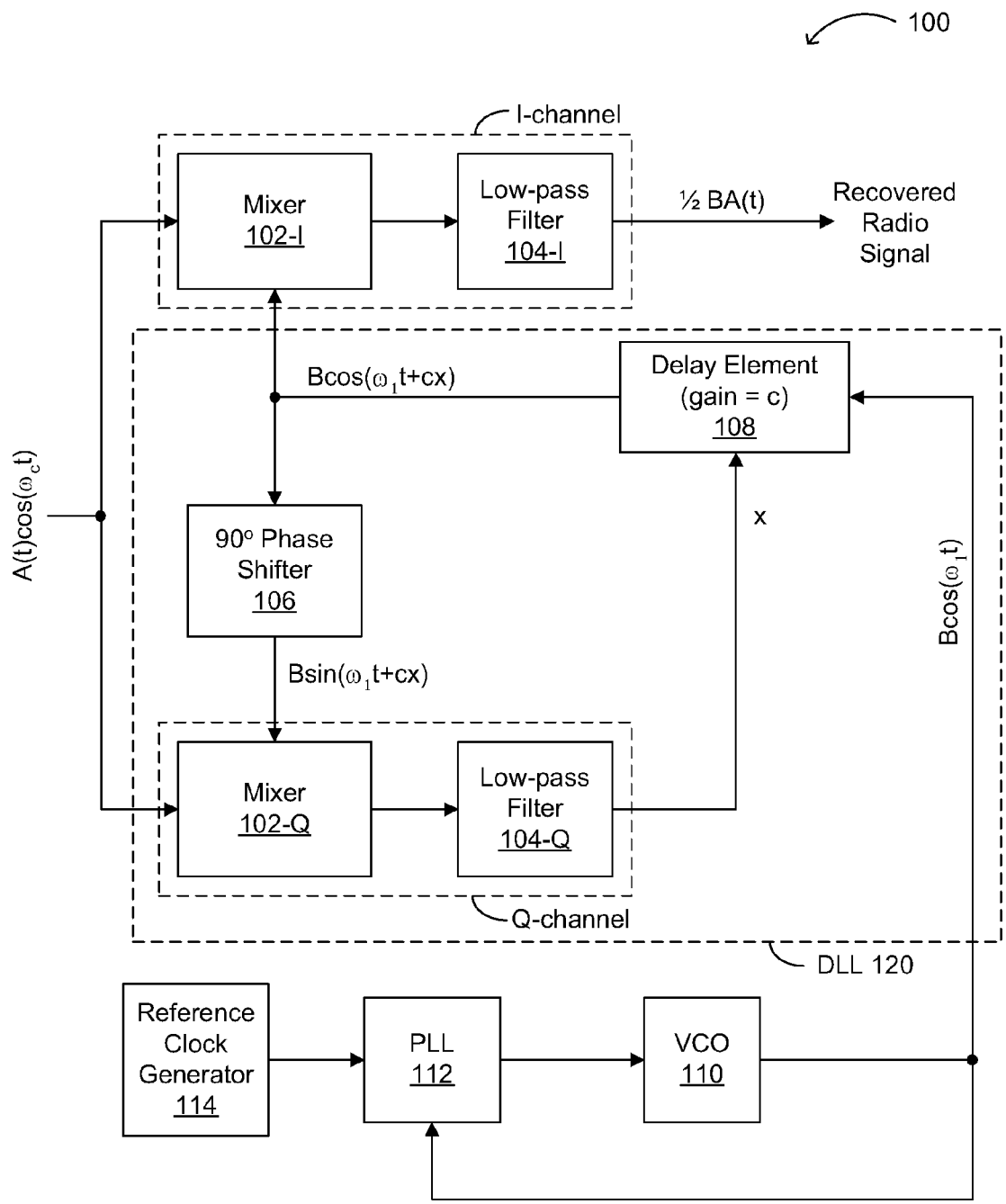
FIG. 1 is a schematic block schematic diagram showing a receiver.
Figure 2:
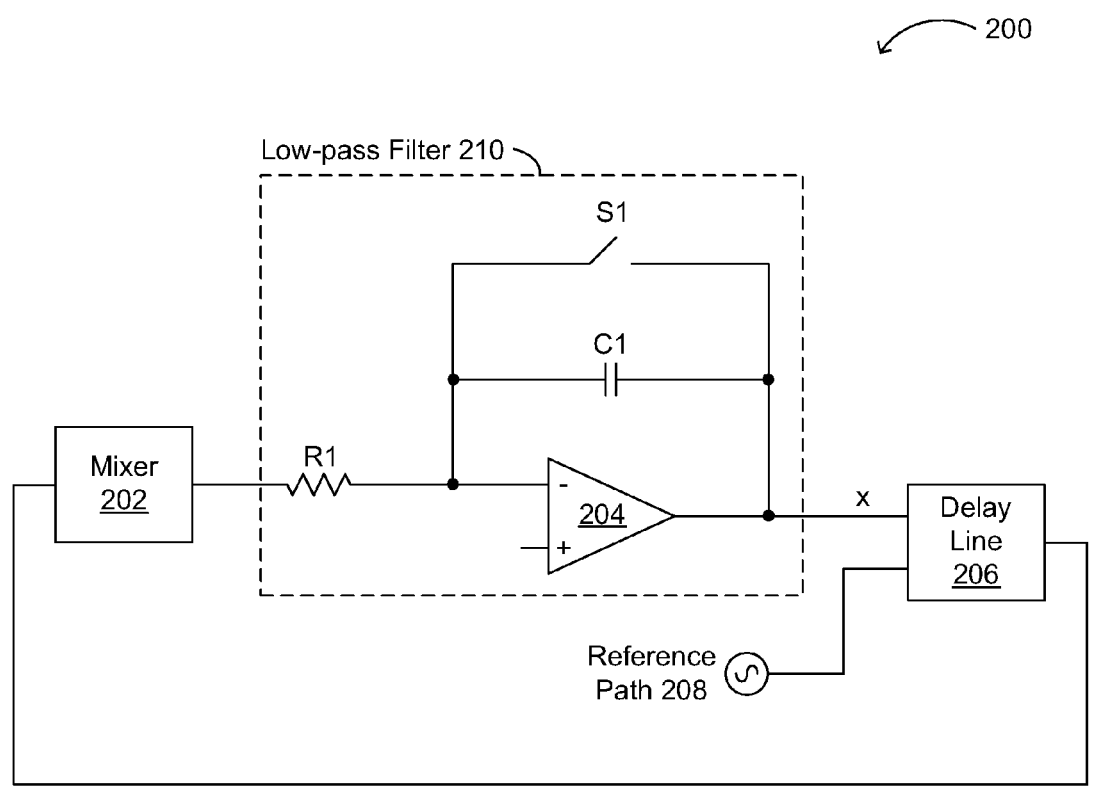
FIG. 2 is a schematic block diagram showing a reset circuit for resetting a DLL at a fixed rate.
Figure 3A:
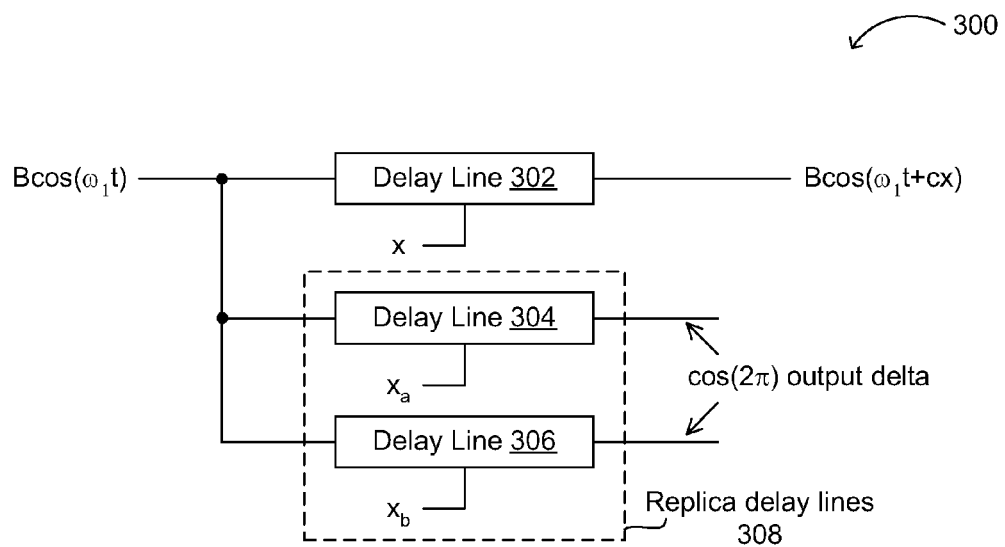
FIGS. 3A and 3B are schematic block diagrams showing a reset circuit utilizing two replica delay lines.
Figure 3B:
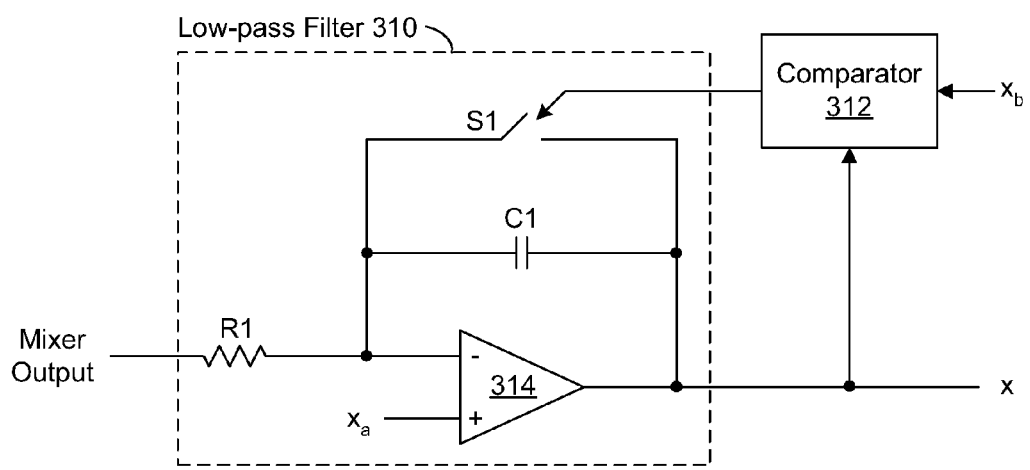

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams, or waveforms within a computer, processor, controller, and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "operating," "calculating," "determining," or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," and "signal" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which may refer to direct or indirect connections, couplings, or communications), but these terms are generally given their art-recognized meanings herein.

Embodiments of the present invention advantageously provide a reliable approach for synchronization of a reference clock to an incoming signal during baseband frequency recovery. The invention, in its various aspects, will be explained in greater detail below with regard to exemplary embodiments.

According to various embodiments of the present invention, an architecture or circuit for synchronization of a reference clock to an incoming signal (e.g., a radio signal) during baseband frequency recovery can include the use of a delay element and/or circuit in a delay-locked loop (DLL). A delay adjustment signal from this delay element can be provided to a first channel (e.g., an I-channel in a baseband receiver), while a phase adjustment signal can be provided to a second channel (e.g., a Q-channel in a baseband receiver). The second channel can provide a delay control signal for control of the delay element, while the first channel can provide a recovered radio signal using the delay adjustment signal. Further, a reset control circuit can be included to appropriately reset the delay control signal.

For directly converting transmitted data (e.g., a radio signal) into a baseband signal frequency, a modified Costas receiver may be used. In a conventional variation of this type of receiver, a voltage-controlled oscillator (VCO) may be used in the data recovery path, in addition to the VCO in the reference clock path. However, in accordance with embodiments of the present invention, one of these two VCOs can be replaced with a delay element. In particular, a DLL may be included in the data and/or clock recovery circuitry in which the delay element(s) receive a delay control signal as part of the loop circuit and a delay synchronization signal from a replica delay circuit. This approach can allow for improved synchronization of the reference clock to a received radio signal during baseband frequency recovery.

An Exemplary Delay-Locked Loop

In one aspect, the present invention relates to a delay-locked loop, comprising (i) a replica delay block, configured to receive a reference clock signal, a reference voltage or current, and a delay synchronization signal, and to output a delayed clock signal; (ii) a phase and/or frequency detector configured to output the delay synchronization signal in response to the reference clock signal and the delayed clock signal; and (iii) a delay line comprising a plurality of main delay blocks operatively connected in series, the delay line configured to receive the reference clock signal, the delay synchronization signal and a delay control signal from a loop circuit including the DLL, and to output a delayed clock signal.

Figure 4:
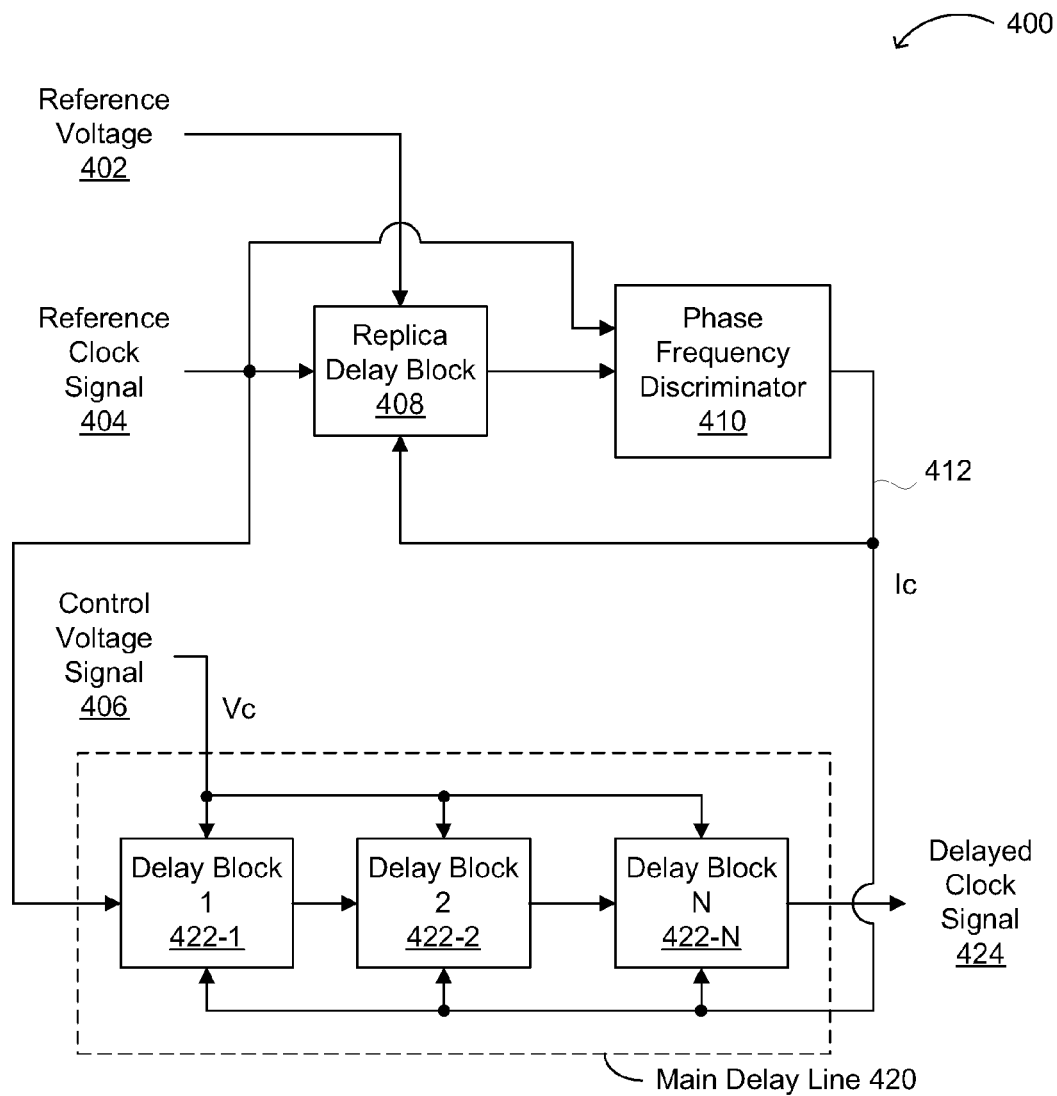
FIG. 4 is a schematic block diagram showing exemplary delay synchronization circuitry and a portion of an exemplary DLL in accordance with embodiments of the present invention.

Referring now to FIG. 4, an exemplary block schematic diagram showing an exemplary delay line and a delay control circuit in accordance with embodiments of the present invention is indicated by the general reference character 400. The delay line is part of a delay locked loop that can be used to recover data and/or clock signals from a wireless (e.g., RF) transmission.

The delay-locked loop receives reference clock signal 404 from a reference clock source. The reference clock source may comprise a crystal oscillator or other source of a periodic signal having a fixed or predetermined frequency, a phase-locked loop, a voltage-controlled oscillator, a frequency divider and/or multiplier, or a combination of such elements. The reference clock signal 404 is passed through main delay line 420, creating a delayed clock signal 424. The amount of delay in main delay line 420 is controlled by two signals. The first control signal may apply a control voltage, Vc, to delay elements in the delay line 420, and is shown in this embodiment as control voltage signal 406. The second control signal, or delay synchronization signal 412, is provided by a delay control circuit, shown in this embodiment as replica delay block 408 and phase frequency discriminator 410. The delay synchronization signal may set or fix the delay of the main delay line 420 to a known value at predetermined reference conditions, and facilitate keeping the delay of main delay line 420 within a predetermined range under typical operating conditions. In one embodiment, the delay synchronization signal provides a current, Ic, to the delay elements (e.g., 422-1 through 422-N) in the delay line 420. The delay in this embodiment may be proportional to both control inputs under one or more predetermined conditions (e.g., Vc=reference voltage 402, or when a capacitor in the delay element [not shown] has been charged with the current Ic to the control voltage Vc).

The control signals input to replica delay block 408 are analogous to the control signals input to main delay line 420. The first control signal input to the replica delay block 408 is reference voltage 402. In one embodiment, reference voltage 402 is a fixed, predetermined and/or constant voltage, provided by a conventional fixed voltage generator (not shown). The clock input to replica delay block 408 is reference clock signal 404. The phase of the output of replica delay block 408 is then compared to the phase of the input to replica delay block 408 (i.e., reference clock 404) using phase frequency discriminator 410. The output 412 of phase frequency discriminator 410 is then provided as feedback to the replica delay block 408 and as the delay synchronization signal 412 to the main delay line 420. When the DLL is locked, the reference clock signal 404 and the delay synchronization signal 412 are phase-matched, and the delay through replica delay block 408 is an integral number of periods of the clock signal. Preferably, the delay through replica delay block 408 is 1 period (Ts) of the reference clock 404. The delay remains at this value (while the DLL is locked), regardless of process and/or voltage variations.

The main delay line 420 comprises a plurality of delay blocks (e.g., 422-1, 422-2 through 422-N, where N equals the integer number of delay blocks in main delay line 420). Preferably, each delay block 422 in the main delay line 420 has the same structure as the other delay blocks. In a further embodiment, each delay block 422 in the main delay line 420 has the same structure as the replica delay block 408. In this "same structure" embodiment, the delay through each delay block 422 is also 1 period, when the replica delay block 408 and the delay blocks 422-1 through 422-N operate under the same conditions. The individual delay element(s) in each delay block are conventional, and may comprise, for example, an analog delay element with two bias signals (e.g., control voltage Vc and/or delay synchronization current Ic) applied to a chain of bias-controlled inverters, or a digital (or digitally-selectable) chain of inverters. In the former case, the delay provided by the inverters is dependent on the bias (e.g., so-called "current starved" inverters, where the amount of the delay can be correlated to the value of the bias voltage applied to transistors that provide current to and/or sink current from the inverters). In the latter case, main delay line 420 may further comprise an analog-to-digital converter (ADC), and the delay control signal Vc may be converted to a multi-bit digital signal by the ADC.

Because the delay synchronization signal 412 is common to both replica delay block 408 and main delay line 420, the delay through main delay line 420 can be determined as shown in Equation 1:

$$\text{Delay} = N * Ts * Vc / (Vref) \quad (1)$$

where Vref is the reference voltage 402. One period of delay in the positive direction is obtained by applying a control voltage Vc to the main delay line 420, where $Vc = Vref*(N+1)/N$. Similarly, to obtain one period of delay in the negative direction, a control voltage, Vc, can be applied where $Vc = Vref*(N-1)/N$. Assuming that the delay of the DLL (e.g., DLL 520 in FIG. 5) is 0 Ts at a control voltage of 0V, and that the curve of time delay vs. control voltage is linear, a time delay of N−1 periods occurs through main delay line 420 when the control voltage is (N−1)/N times the reference voltage (i.e., $Vc = (N-1)/N*Vref$). Accordingly, (N+1)/N periods of delay occurs when the control voltage is (N+1)/N of the reference voltage (i.e. $Vc = (N+1)/N\ Vref$). Alternatively or additionally, the gain of the delay blocks 422 can be changed so that a different reference voltage may allow for a larger or smaller control voltage changes in the DLL, if desired. If four delay blocks are used in the main delay line (i.e., N=4), then a control voltage of 5/4 Vref provides a delay shift of one period in the positive direction, and a control voltage of 3/4 Vref provides a delay shift of one period in the negative direction.

Figure 5:
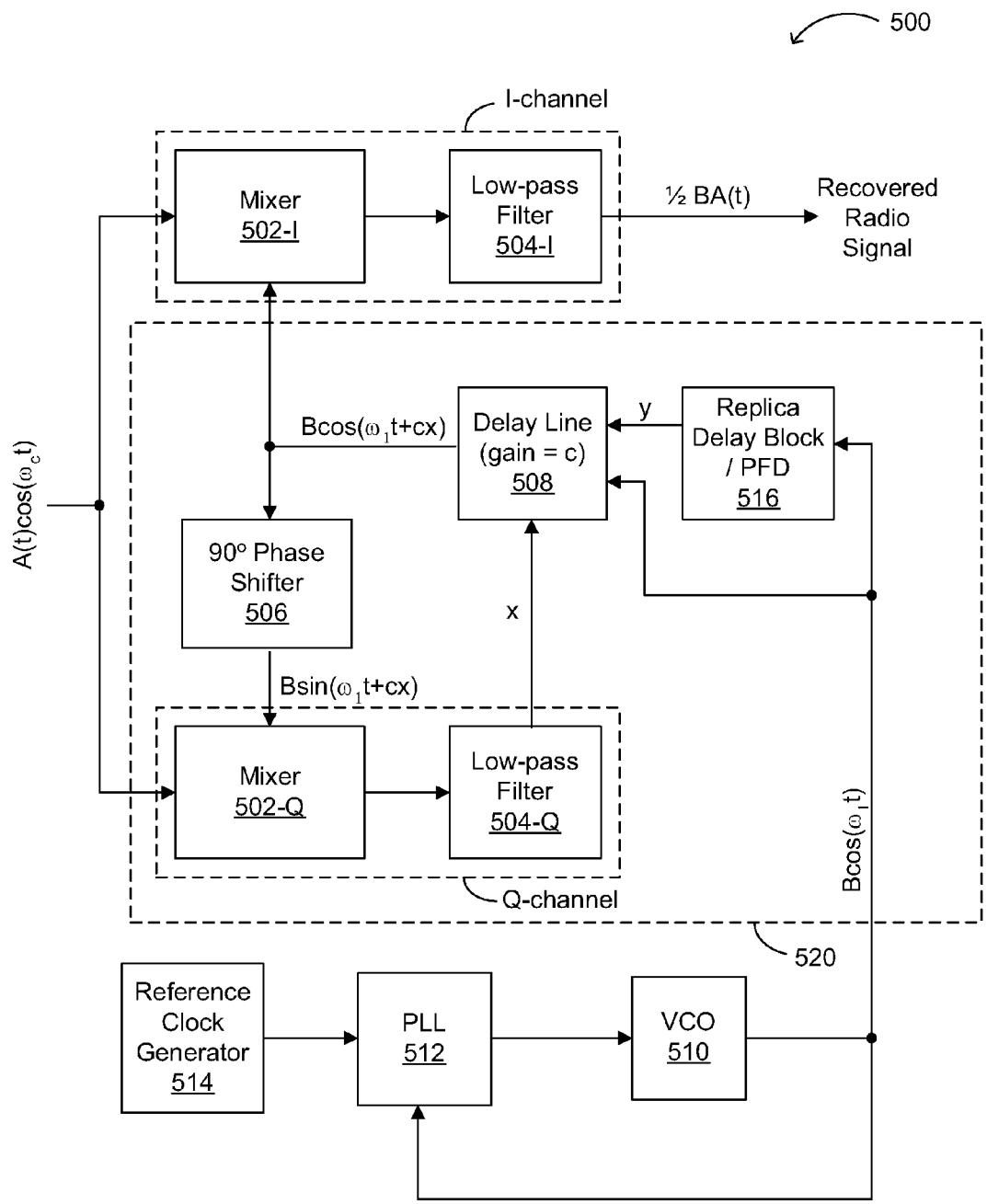
FIG. 5 is an exemplary schematic block diagram showing a receiver utilizing the DLL in accordance with embodiments of the present invention.

If the control voltage Vc is reset to the reference voltage Vref whenever it reaches $Vref*(N\pm1)/N$, the output of the delay line (e.g., delayed clock 424) shifts by one period. Since a shift in a clock signal of one period looks the same in time as the unshifted clock signal, the output will appear to be continuous (e.g., with an infinite amount of phase shift). Naturally, more replica blocks 408 may be added if longer reference delays (e.g., 2 or more periods) are desired, and/or more or less delay blocks 422 can be in the main delay line 420 to allow for a smaller or larger range for the control voltage Vc relative to the reference voltage Vref, respectively, In a particular embodiment, the reference clock signal 404 shown in FIG. 4 is the output of a voltage-controlled oscillator (VCO). For example, the VCO may be VCO 510 shown in FIG. 5. The output of VCO 510 is generally a waveform with a frequency that is (p/q) times the frequency of the reference clock generator 514, where p is a multiplier (e.g., of a conventional frequency multiplier) and q is a divisor (e.g., of a conventional frequency divider). In various embodiments, q is 1 (e.g., the VCO or reference clock path contains no divider) and p is $2^n$, where n is an integer greater than or equal to 1. Referring to FIG. 5, VCO 510 receives an output from phase-locked loop (PLL) 512, which receives the VCO output as feedback and a reference clock signal from reference clock generator 514 as an input.

In a particular embodiment, the output of VCO 510 is a periodic or sinusoidal waveform with a frequency $2^n$ (e.g., 8) times the frequency of the reference clock. The output of the VCO may be converted using a D-flip flop (not shown) into a 50% duty cycle waveform at $2^{n-1}$ times the frequency of the reference clock generator 514 before it is provided to the delay-locked loop (e.g., as $B\cos(\omega_1 t)$ in FIG. 5 or as the reference clock signal 404 in FIG. 4).

Referring back to FIG. 4, replica delay block 408 may comprise a single block of $2^n$ units or cells, each able to delay one edge of the reference clock 404. Each delay block 422 may have a number of delay units or elements that is related to the duty cycle and the number of periods of delay provided by the block. For example, when delay block 422 has 4 delay units, and the total delay length is 1 period, each unit delays the reference clock by 25% of a period. This further allows each unit (or cell or element, all of which are interchangeable terms) to delay from 0% to 50% of the duty cycle when the duty cycle is 50%. However, a unit or cell cannot delay the clock by more than the duty cycle, because there can be no periodic output when the delay exceeds the duty cycle of the clock.

In the embodiment of FIG. 4, main delay line 420 may comprise four delay blocks (i.e., N in 422-N is 4). Given that each unit cell can delay from 0% to 50% of a duty cycle and each block 422 has four delay units, the main delay line (or signal path delay line) will be able to vary its delay from 0 to 8 periods. When replica delay block 408 is locked, each delay block 422 provides a delay of 1 period. Thus, the main delay line 420 delays the reference clock 404 by 4 periods when the control voltage, Vc, is about equal to the reference voltage, Vref. Similarly, if the control voltage, Vc, is reset to the reference voltage, Vref, main delay line 420 provides a delay of 4 periods when it is reset. Also, as long as the control voltage 406 stays within the range of from (0.75)Vref to (1.2)*Vref, the DLL remains locked and in continuous operation, without glitches or other errors during a reset operation. To achieve a continuous delay, when the delay blocks 422 in the delay line 420 provide the same delay as the replica delay block 408, the control voltage Vc may be adjustable within a range defined by the number of delay blocks in the delay line N and the reference voltage 402, to increase or decrease the delay provided by the main delay line 420 by no more than the number of periods of delay provided by the replica delay block 408.

An Exemplary Receiver Circuit

An exemplary receiver circuit according to the present invention can include (i) a first channel configured to receive a radio signal and provide a recovered radio signal from the radio signal and a delayed clock signal; and (ii) a delay-locked loop configured to receive a reference clock signal and a radio signal and provide the delayed clock signal from the radio signal and the reference clock signal, the delay-locked loop configured to shift the delayed clock signal an integral number of reference clock signal periods when reset.

Referring now to FIG. 5, an exemplary block schematic diagram showing a delay line receiver in accordance with embodiments of the present invention is indicated by the general reference character 500. Here, delay line 508 may comprise main delay line 420 in FIG. 4, with two bias signals (e.g., delay control signal x and delay synchronization signal y) applied thereto. Delay line 508 has a characteristic gain, c. The delay control signal x can be used to control the delay of the delay line 508 using adjustable delay elements or other such circuit components within delay line 508, or within individual delay blocks (e.g., 422 in FIG. 4) to provide a controllable delay path. Also, the delay-locked loop (DLL) 520 includes the delay line 508, 90° phase shifter 506, mixer 502-Q, and low-pass filter 504-Q, which can essentially be used in place of a traditional VCO (after a phase discriminator), where the VCO and/or phase discriminator may be found in conventional approaches.

Referring again to FIG. 5, an input signal (e.g., a radio signal) having a periodic and/or sinusoidal waveform (e.g., having a waveform $A(t)\cos(\omega_c t)$) can be received by an antenna (not shown) and input to mixers 502-I and 502-Q in first and second channels of a baseband receiver 500, respectively. Mixers 502-I and 502-Q (each of which may comprise a multiplier and/or adder) may each receive timing signals that are substantially equal in frequency, but that have a phase shift between them. To accomplish this, phase shifter 506 shifts the timing signal output from the delay line 508 (which may be input directly to mixer 502-I) by a predetermined amount (e.g., 90°) before mixer 502-Q receives it. For example, the delayed clock signal (e.g., $B \cos(\omega_1 t + cx)$) may be applied to mixer 502-I and phase shifter 506, while a phase-shifted clock signal may be applied to mixer 502-Q. Typically, the phase-shifted clock signal comprises the delayed clock signal phase-shifted by 90° (e.g., $B \sin(\omega_1 t + cx)$), but other phase shifts having known and/or predetermined relationships to the delayed clock signal and/or the delay control signal may also be used. In addition, each mixer output may be passed through a corresponding low-pass filter (e.g., 504-I in the I-channel, and 504-Q in the Q-channel) to remove higher frequency summation terms.

As discussed above, the received radio signal in this particular example can have the general form $A(t)\cos(\omega_c t)$, where $A(t)$ can be any time-varying signal, and may refer to an amplitude of the signal as a function of time. The term "cos" (or cosine) indicates a sinusoidal and/or periodic waveform, $\omega$ represents an angular frequency, where $\omega=2\pi f$ (where "f" is the frequency of the sinusoidal waveform), and "t" generally represents time. Further, the general form of the recovered radio signal $B(t)$ is ideally a square wave, but may comprise any oscillating signal, such as one having a sinusoidal or other regular periodic form.

VCO 510 generally provides a reference clock (e.g., $B \cos(\omega_1 t)$) from a phase-locked loop (PLL) 512. For example, a reference clock generator 514 (e.g., a crystal oscillator) may be used to generate a periodic or oscillating signal, and that periodic/oscillating signal is provided to PLL 512, which is coupled to VCO 508. The output of VCO 508 is a waveform with a frequency of p/q times the frequency of the reference clock signal provided by reference clock generator 514, where p/q is a combined (fractional) multiplication factor of the PLL 512 and the VCO 510. In one implementation, the combined multiplication factor is 4. In one embodiment, the output of VCO 508 is converted using a D-flip flop (not shown) into a 50% waveform before it is provided to the delay-locked loop (DLL) 520. Replica delay block/phase-frequency detector PFD 516 can receive the reference clock and provide a delay synchronization signal to delay line 508. The PFD portion of the delay synchronization circuitry 516 can be any of the four principal types of phase and phase-frequency detectors. Delay line 508 receives the phase-locked, frequency-multiplied reference clock from VCO 510, the delay synchronization signal y from delay synchronization circuitry 516, and delay control signal x, and provides a delayed clock signal (e.g., $B \cos(\omega_1 t + cx)$) and/or phase-shifted clock signal (e.g., $B \sin(\omega_1 t + cx)$, via phase shifter 506 to the mixers 502-I and 502-Q for data and/or clock recovery from the radio signal.

Generally, the I-channel provides the desired signal (e.g., the recovered data and/or clock signal), while the Q-channel provides a correction term or delay control signal x that may be applied to delay line 508. Delay elements within delay line 508 may take a particular input frequency and delay an output by a predetermined amount of time. In this particular example, delay line 508 can produce a delay adjustment signal $B \cos(\omega_1 t + cx)$ from the reference clock $B \cos(\omega_1 t)$, where x is the amount of delay time provided by delay line 508, and c is the gain of delay line 508. Accordingly, an output of multiplier or mixer 502-I may be $A(t)\cos(\omega_c t) B \cos(\omega_1 t + cx)$. Also, the sum (or mixed) frequency term provided by mixer 502-I can be removed by the use of low-pass filter 504-I, and when it is, an output of the I-channel can be further simplified, as shown below in Equation 2:

$$\tfrac{1}{2}A(t)B\cos((\omega_1-\omega_c)t+cx)=\tfrac{1}{2}A(t)B\cos(\Delta\omega t+cx) \qquad (2)$$

The output of multiplier or mixer 502-Q may thus be represented by the waveform $A(t)\cos(\omega_c t) B \sin(\omega_1 t + cx)$. Also, when its sum frequency term is removed by low-pass filter 504-Q, an output of the Q-channel can simplify further, as shown below in Equation 3:

$$\tfrac{1}{2}A(t)B\sin((\omega_1-\omega_c)t+cx)=\tfrac{1}{2}A(t)B\sin(\Delta\omega t+cx) \qquad (3)$$

When sin(Y) is relatively small, it may be assumed that a linear approximation of sin(Y) is about Y. As a result, Equation 3 can be further simplified, as shown below in Equation 4:

$$\tfrac{1}{2}A(t)B\sin(\Delta\omega t+cx)=\tfrac{1}{2}A(t)B(\Delta\omega t+cx) \qquad (4)$$

Equation 4 can therefore represent an output of the Q-channel, which may be designated as delay control signal x. Consequently, Equation 4 can then be solved for x, as shown below in Equation 5:

$$x=\Delta\omega t/((2/(A(t)*B))-c) \qquad (5)$$

Further, in certain configurations, the gain c of delay line 508 may be much greater than 2/A(t)B, such that Equation 5 may be further simplified, as shown below in Equation 6:

$$x=-\Delta\omega t/c, \text{ or } cx=-\Delta\omega t \qquad (6)$$

The result from Equation 6 above (which can provide a useful approximation of the time delay provided by delay line 508) can be placed into Equations 2 and 3 above, such that the recovered radio signal at the I-channel output can be simplified to ½A(t)B cos(0)=½BA(t), while the delay control signal at the Q-channel output can be simplified to ½A(t)B sin(0)=0. Accordingly, as long as c>>2/A(t)B, the linear approximation above to sin(Y) can be considered valid, and the desired output, corresponding to a delay control signal value of 0, may be achieved.

From Equation 6, the control input to the delay line 508 is negatively proportional to the difference in time. This implies that after a long period of time, the control voltage into any delay blocks, units, elements, or cells in the delay line 508 would also become increasingly large in magnitude. This is obviously not practical for a system with limited control or power supply voltage. For reasons already discussed, this is overcome by resetting the control voltage of the delay elements to a reference value when the control voltage x reaches a value corresponding to a phase shift of an integral number of periods (preferably one period of the reference clock B cos ($\omega_1$t)) in the positive or negative direction. This occurs when the control voltage reaches one of the values in Equations 7a and 7b, where N is the number of delay blocks in the main delay line. This equates to a control voltage of 5/4 Vref and 3/4 Vref for the case where four delay blocks (or N=4) are used in the main delay line.

$$Vc = Vref^*(N+1)/N \qquad (7a)$$

$$Vc = Vref^*(N-1)/N \qquad (7b)$$

An Exemplary Reset Circuit for a Delay-Locked Loop (DLL)

An exemplary circuit for resetting a delay in a DLL can include (i) a filter circuit configured to receive a phase error signal and a reset signal, and provide a delay control signal, the filter circuit configured to set the delay control signal to a reset value in response to the reset signal; and (ii) a comparator, the comparator configured to receive the delay control signal and provide the reset signal in response to the delay control signal reaching one or more predetermined values.

As seen above in Equation 6, a control input or delay control signal x provided to a delay element within delay line 508 may be negatively proportional to a time-based delta (e.g., $cx = -\Delta\omega t$). Thus, after a relatively long period of time, delay control signal x, and thus a control voltage or a DC offset of the delay element 508, can also become increasingly large in magnitude. To address systems and/or applications in which the power supply and/or available supply voltage may be limited, the delay control signal can be reset to a reference value in accordance with embodiments of the present invention when the control voltage reaches one of a plurality of predetermined values.

Figure 6:
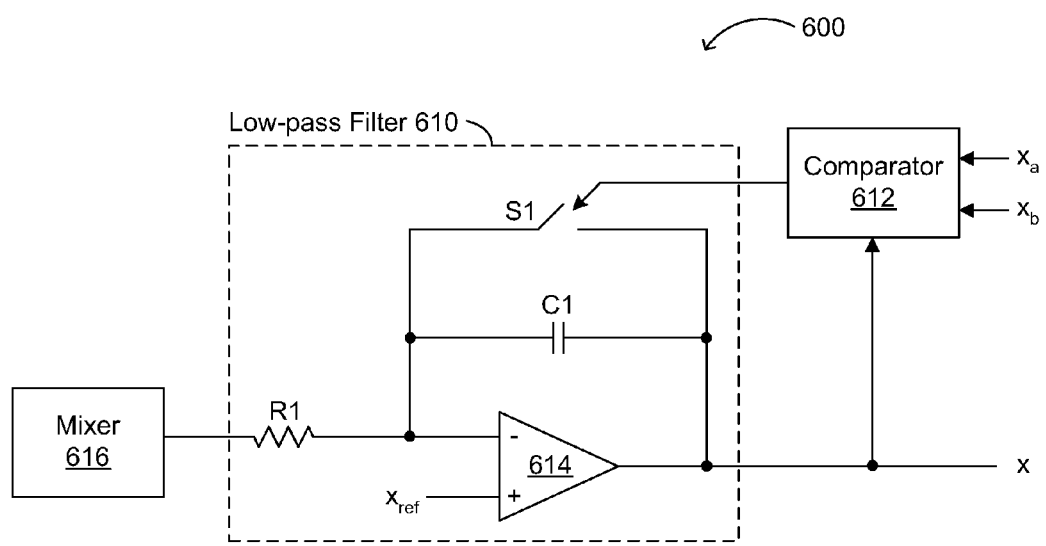
FIG. 6 is an exemplary schematic diagram showing a reset circuit for the DLL in accordance with embodiments of the present invention.

FIG. 6 shows an exemplary schematic diagram showing a DLL reset circuit 600. Mixer 616 (which generally corresponds to mixer 502-Q in FIG. 5) provides an output to low-pass filter 610 (which generally corresponds to filter 504-Q in FIG. 5) formed by resistor R1, capacitor C1, and operational amplifier 614 (which receives both the RC-filtered output of mixer 616 and a reference voltage). Further, low-pass filter 610 may further include switch S1, which resets the low-pass filter 610 by discharging capacitor C1 when closed. Preferably, during a reset operation, switch S1 is closed (e.g., in response to an active reset signal) for a length of time sufficient to discharge substantially all of the charge on capacitor C1.

Comparator circuit 612 is configured to detect when delay control signal x reaches either a minimum value (denoted as $x_a$) or a maximum value (denoted as $x_b$) so that a pulse can be provided to close switch S1 in low-pass filter 610 upon such an occurrence. When S1 is closed, operational amplifier 614 can produce a unity gain feedback for input $x_{ref}$ such that delay control signal x is reset to the value of input $x_{ref}$. Input $x_{ref}$ generally corresponds to reference voltage 402 in FIG. 4. Of course, the $x_a$ and $x_b$ inputs may be switched in the scheme of FIG. 6 for a negative-ramping x. Other arrangements and/or circuits can also be used in accordance with embodiments of the present invention.

An Exemplary Method of Recovering a Modulated Radio Signal

An exemplary method of recovering a modulated radio signal, can include the steps of (i) generating a delay adjustment signal by delaying a reference clock by a configurable delay; (ii) phase-shifting said delay adjustment signal to provide a phase adjustment signal; (iii) generating a delay control signal within a predetermined range from a received radio signal and said phase adjustment signal; and (iv) recovering said modulated radio signal from said received radio signal and said delay adjustment signal.

Figure 7:
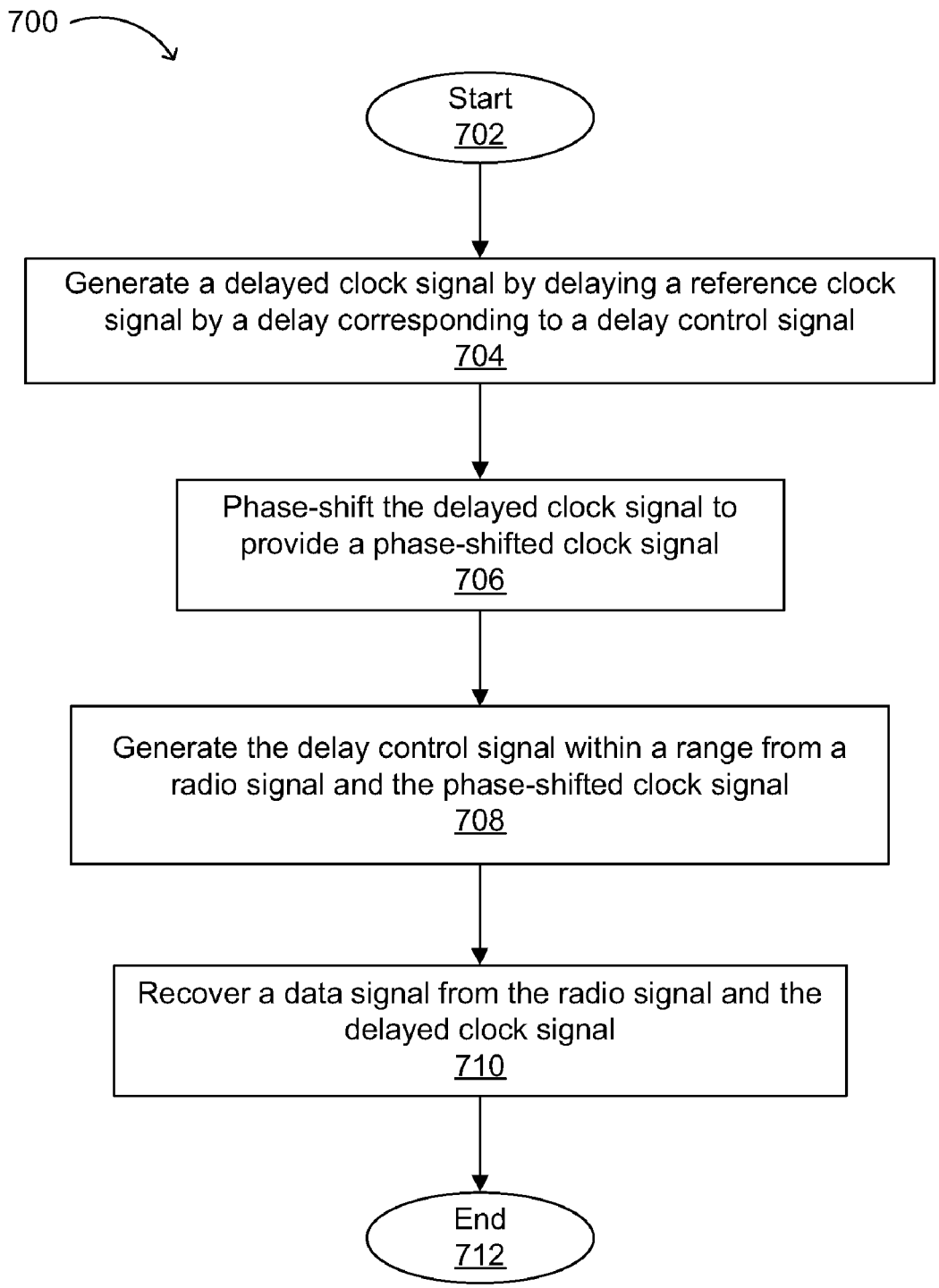
FIG. 7 is a flow diagram showing an exemplary method of recovering a modulated radio signal in accordance with embodiments of the present invention.

Referring now to FIG. 7, a flow diagram showing an exemplary method of recovering a modulated radio signal in accordance with embodiments of the present invention is shown and indicated by the general reference character 700. The flow can begin (702), and a delay adjustment signal can be generated by delaying (e.g., via a delay line) a reference clock using a configurable delay (704). The delay adjustment signal can be phase-shifted (e.g., by about 90°) to provide a phase adjustment signal (706). The phase shift may be by another amount providing a known and/or predictable relationship between the delay adjustment signal and the delay provided by a delay line (e.g., delay line 420 in FIG. 4 or delay line 508 in FIG. 5) in a DLL used to recover the modulated radio signal. Referring back to FIG. 7, a delay control signal having a value within a predetermined range can be generated from a received radio signal and the phase adjustment signal (708). The predetermined range may correspond to a phase and/or frequency shift of one clock period in either direction, positive or negative, of the reference clock by the delay line. The modulated radio signal can then be recovered from the received radio signal using the delay adjustment signal (710), and the flow can complete (712). The method may be modified and/or supplemented in accordance with the operation(s) of the delay synchronization circuitry and delay line 420 described above with regard to FIG. 4, the radio receiver 500 described above with regard to FIG. 5, the reset circuits described above with regard to FIG. 6, and/or the method described below with regard to FIG. 8.

Exemplary Method of Synchronizing a Reference Clock to a Radio Signal During Baseband Frequency Recovery An exemplary method of synchronizing a reference clock to a radio signal can include the steps of (i) receiving the radio signal in first and second channels, the first channel providing a recovered radio signal using a delay adjustment signal, and the second channel providing a delay control signal using a phase adjustment signal derived from the delay adjustment signal; (ii) controlling a delay element using the delay control signal, the delay element receiving a reference clock and providing the delay adjustment signal; and (iii) resetting the delay control signal when the delay control signal reaches one or more predetermined values.

Figure 8:
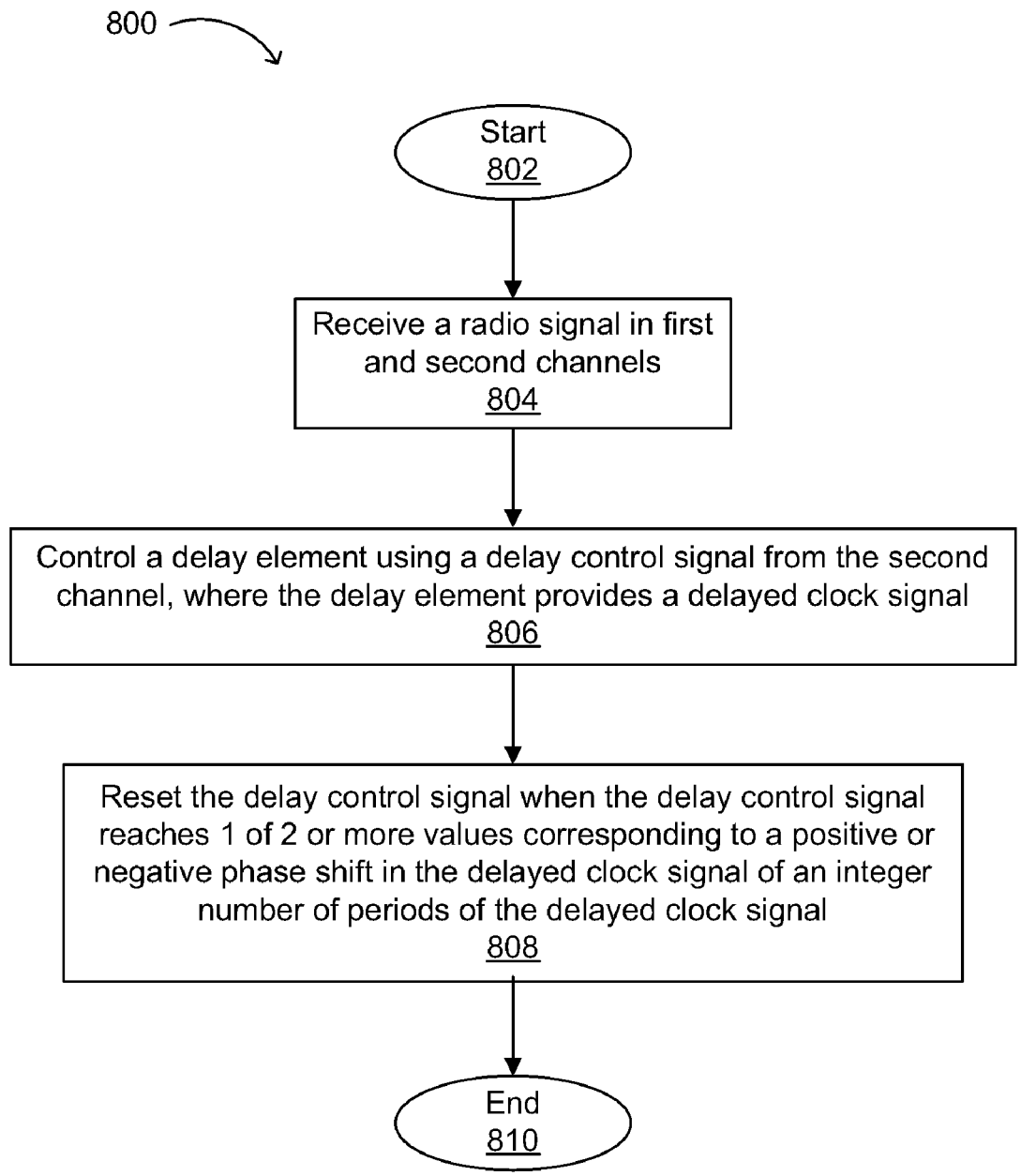
FIG. 8 is a flow diagram showing an exemplary method of synchronizing a reference clock to a radio signal during baseband frequency recovery in accordance with embodiments of the present invention.

Referring now to FIG. 8, a flow diagram showing an exemplary method of synchronizing a reference clock to a radio signal in accordance with embodiments of the present invention is indicated by the general reference character 800. The flow can begin (802) and a radio signal can be received in first and second channels (804). For example, the radio signal can be received in an I-channel and a Q-channel, where each channel includes a mixer and a low-pass filter, as shown in FIG. 5.

Next, referring back to FIG. 8, a delay element (e.g., in a DLL that includes elements of the second channel) can be controlled using a delay control signal from the second channel (806). In the example of FIG. 5, such a delay control signal can be provided by the Q-channel. Next, the delay control signal can be reset when the delay control signal reaches one of a plurality of predetermined values (808), and the flow can complete (810). As discussed above, the delay control signal can be reset at predetermined values to provide a shift of one period making the output appear continuous.

While the above examples include particular implementations of radio receiver and DLL control and reset circuitry, as well as particular forms of time-varying signals, one skilled in the art will recognize that other technologies and/or signal types or forms may also be used in accordance with embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A delay-locked loop, comprising:
   a) a replica delay block having a first delay control input and a second delay control input, said delay block being configured to receive a reference clock signal, a first delay control signal at said first delay control input, and a delay synchronization signal at said second delay control input, and to output a replica-delayed clock signal;
   b) a phase and/or frequency detector configured to output said delay synchronization signal in response to said reference clock signal and said replica-delayed clock signal; and
   c) a delay line having a third delay control input and a fourth delay input, said delay line including a plurality of main delay blocks operatively connected in series, said delay line configured to receive said reference clock signal at the first of said delay blocks connected in series, said delay synchronization signal at said third delay control input and a second delay control signal at said fourth delay control input, and configured to output a delayed clock signal.

2. The delay-locked loop of claim 1, wherein each of said plurality of main delay blocks has a structure substantially similar to a structure of said replica delay block.

3. The delay-locked loop of claim 1, further comprising a reset circuit configured to reset said delay-locked loop.

4. The delay-locked loop of claim 1, wherein said second delay control signal is a control voltage, said first delay control signal is a reference voltage, and said delay synchronization signal is a current signal;
   wherein the delay provided by said replica delay block is dependent upon a capacitor, and said reference voltage establishes a maximum voltage setting for said capacitor and current from said synchronization signal varies the voltage of said capacitor.

5. The delay-locked loop of claim 1, further comprising a phase shifter configured to receive said delayed clock signal and output a phase-shifted clock signal.

6. The delay-locked loop of claim 5, wherein said phase shifter shifts said delayed clock signal by $(2n+1)\pi/2$ radians, where n is an integer.

7. The delay-locked loop of claim 5, further comprising a mixer configured to receive a radio signal and said phase-shifted clock signal and output an unfiltered delay control signal.

8. The delay-locked loop of claim 7, further comprising a low-pass filter configured to receive said unfiltered delay control signal and output said delay control signal.

9. A receiver circuit, comprising:
   a) a first channel configured to receive a radio signal and a delayed clock signal and provide a data signal;
   b) a second channel configured to receive said radio signal and provide a delay control signal in response to a phase difference between said radio signal and said delayed clock signal;
   c) a replica delay block and phase frequency detector configured to receive a reference clock signal and provide a delay synchronization signal; and
   d) a delay line configured to receive said reference clock signal, said delay synchronization signal and said delay control signal, and to output said delayed clock signal.

10. The receiver circuit of claim 9, wherein said reference clock signal has a predetermined frequency, the receiver circuit further comprising a voltage controlled oscillator (VCO), said VCO being configured to provide said reference clock signal.

11. The receiver circuit of claim 9, further comprising a reset circuit configured to set said delay control signal to an initial state when said delay control signal reaches one or more predetermined values.

12. The receiver circuit of claim 9, further comprising a phase shifter configured to receive said delayed clock signal and provide a phase-shifted clock signal.

13. The receiver circuit of claim 12, wherein said delayed clock signal differs in phase from said phase-shifted clock signal by substantially 90°.

14. The receiver circuit of claim 9, wherein said first channel includes a first mixer and a first filter.

15. The receiver circuit of claim 14, wherein said second channel includes a second mixer and a second filter.

16. The receiver circuit of claim 15, wherein each of said first and second filters is a low-pass filter.

* * * * *